United States Patent [19]

Dennison et al.

[11] Patent Number: 5,229,326
[45] Date of Patent: Jul. 20, 1993

[54] METHOD FOR MAKING ELECTRICAL CONTACT WITH AN ACTIVE AREA THROUGH SUB-MICRON CONTACT OPENINGS AND A SEMICONDUCTOR DEVICE

[75] Inventors: Charles H. Dennison; Guy T. Blalock, both of Boise, Id.

[73] Assignee: Micron Technology, Inc., Boise, Id.

[21] Appl. No.: 902,374

[22] Filed: Jun. 23, 1992

[51] Int. Cl.$^5$ .................... H01L 21/44; H01L 21/48
[52] U.S. Cl. .................................. 437/195; 437/41;
       437/44; 437/183; 437/203
[58] Field of Search ............. 437/195, 183, 203, 44,
       437/41, 228, 189

[56] References Cited

U.S. PATENT DOCUMENTS

| | | | |
|---|---|---|---|
| 4,617,193 | 10/1986 | Wu | 437/195 |
| 4,868,138 | 9/1989 | Chan et al. | 437/44 |
| 4,892,845 | 1/1990 | Bridges | 437/195 |
| 5,110,766 | 5/1992 | Maeda et al. | 437/228 |
| 5,158,910 | 10/1992 | Cooper et al. | 437/195 |
| 5,171,713 | 12/1992 | Matthews | 437/195 |

*Primary Examiner*—Brian E. Hearn
*Assistant Examiner*—Kevin M. Picardat
*Attorney, Agent, or Firm*—Wells, St. John, Roberts, Gregory & Matkin

[57] ABSTRACT

A semiconducting processing method for making electrical contacts with an active area in sub-micron geometries includes: (a) providing a pair of conductive runners on a semiconductor wafer; (b) providing insulative spacers on the sides of the conductive runners wherein adjacent spacers are spaced a selected distance apart at a selected location on the wafer; (c) providing an active area between the conductive runners at the selected location; (d) providing an oxide layer over the active area and conductive runners; (e) providing a planarized nitride layer atop the oxide layer; (f) patterning and etching the nitride layer selectively relative to the oxide layer to define a first contact opening therethrough, wherein the first contact opening has an aperture width at the nitride layer upper surface which is greater than the selected distance between the insulative spacers; (g) etching the oxide layer within the first contact opening to expose the active area; (h) providing a polysilicon plug within the first contact opening over the exposed active areas; (i) providing an insulating layer over the nitride layer and the polysilicon plug; (j) patterning and etching the insulating layer to form a second contact opening to and exposing the polysilicon plug; and (k) providing a conductive layer over the insulating layer and into the second opening to electrically contact the polysilicon plug. A semiconductor device having buried landing plugs of approximately uniform height across the wafer is also described.

16 Claims, 5 Drawing Sheets

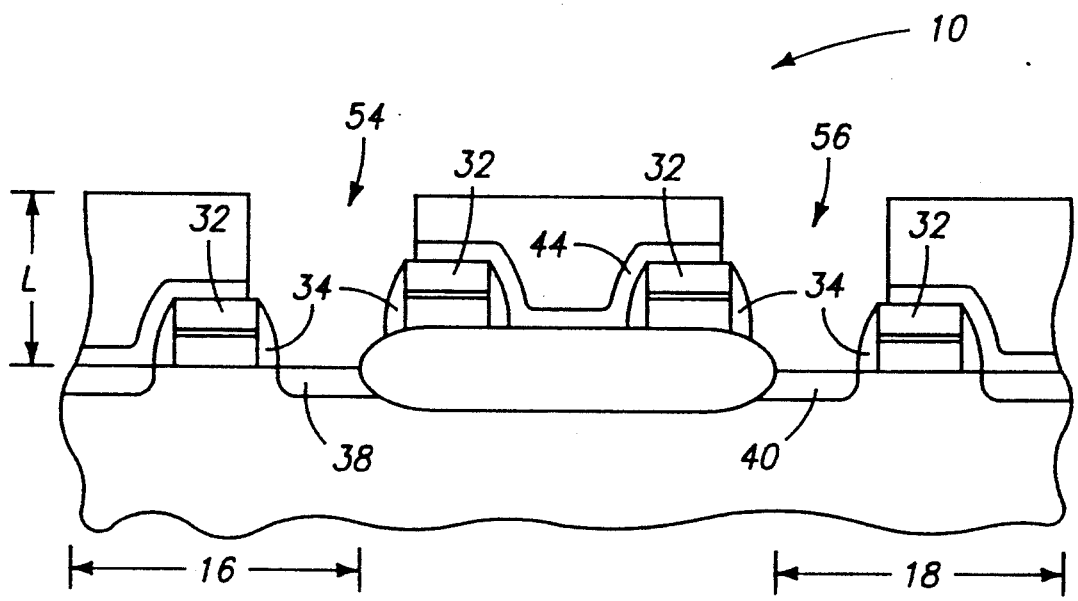
_Fig 5_
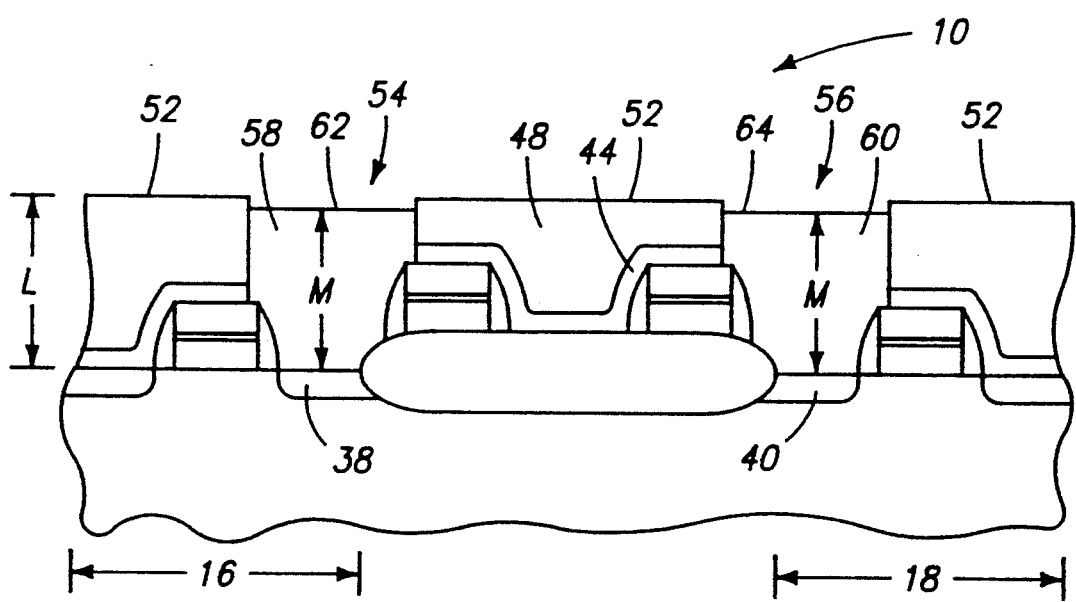
_Fig 6_

METHOD FOR MAKING ELECTRICAL CONTACT WITH AN ACTIVE AREA THROUGH SUB-MICRON CONTACT OPENINGS AND A SEMICONDUCTOR DEVICE

TECHNICAL FIELD

This invention relates to semiconductor processing methods for making electrical contact with an active area and more particularly, for making electrical contact with an active area through sub-micron contact openings. This invention also relates to semiconductor devices having buried contact plugs.

BACKGROUND OF THE INVENTION

As semiconductor devices are scaled down to increase packing density, distances between adjacent components are becoming increasingly smaller. Sub-micron geometries are possible with currently available technologies. In some high-density memory devices, distances between adjacent word lines are required to be 0.4 micron or less to produce a sufficiently dense cell. At these geometries, problems arise when attempting to define contact openings to active areas between these adjacent, tightly spaced word lines. Present photolithographic alignment and metallization techniques are only possible to 0.35 micron features, with a misalignment error of ±0.15 micron. Without the use of self-aligned active area contacts, the minimum word line spacing would be approximately greater than 0.85 micron which is equal to the minimum photolithographic feature of 0.35 micron, plus twice the misalignment tolerance of 0.15 micron, plus twice the processing margin of 0.10 micron (or, 0.35 micron+2×0.15 micron+2×0.10 micron=0.85 micron). Present processing techniques are therefore incapable of producing narrow and properly aligned contact openings to active areas for geometries of 0.4 micron or less.

This invention provides a processing method for making contacts to active areas between semiconductor word line (conductive runners) having sub-micron geometries.

BRIEF DESCRIPTION OF THE DRAWINGS

One or more preferred embodiments of the invention are described below with reference to the following accompanying drawings.

FIG. 5 is a diagrammatic section of the FIG. 1 wafer illustrated at a processing step subsequent to that shown in FIG. 5.

FIG. 6 is a diagrammatic section of the FIG. 1 wafer illustrated at a processing step subsequent to that shown in FIG. 5.

FIG. 10 illustrates advantages of the present invention in diminishing problems associated with misalignment.

DETAILED DESCRIPTION OF THE PREFERRED EMBODIMENTS

Figure 1:
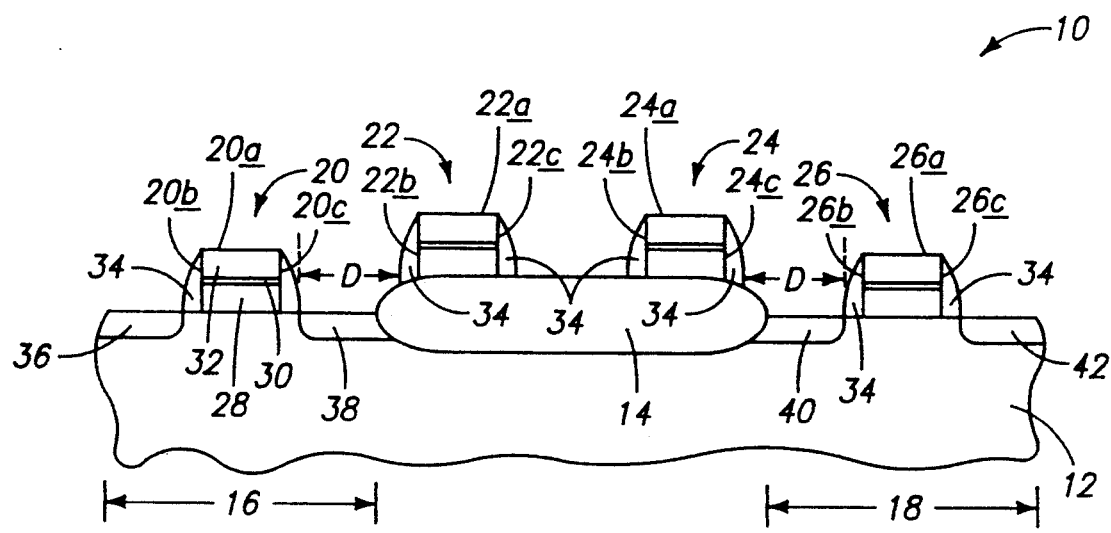
FIG. 1 is a diagrammatic section of a semiconductor wafer shown at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of making electrical contact with an active area on a semiconductor wafer comprises the following steps:

providing a pair of conductive runners on a semiconductor wafer, individual conductive runners having sides;

providing an insulative layer on the sides of the conductive runners, the insulative sides of adjacent conductive runners being spaced a selected distance apart at a selected location on the wafer;

providing an active area between the conductive runners at the selected location;

providing a layer of first oxide to a selected thickness over the active area and conductive runners, the first oxide layer selected thickness being less than one-half the selected distance between the insulative sides of adjacent conductive runners;

providing a first planarized layer of insulating material atop the first oxide layer, the first layer of insulating material being selectively etchable relative to the first oxide, the first layer of insulating material having an upper surface;

patterning the planarized first insulating layer for definition of a first contact opening therethrough to the active area;

etching the patterned first insulating layer selectively relative to the first oxide layer to define the first contact opening therethrough, the first contact opening having an aperture width at the planarized first insulating layer upper surface, the aperture width being greater than the selected distance between the insulative sides of adjacent conductive runners;

etching the first oxide layer within the first contact opening to expose the active area;

providing a plug of conductive material within the first contact opening over the exposed active area;

providing a second insulating layer over the first insulating layer and the conductive plug;

patterning and etching the second insulating layer to form a second contact opening to and exposing the conductive plug; and providing a conductive layer over the second insulating layer and into the second contact opening, the conductive layer electrically contacting the conductive plug.

In accordance with another aspect of the invention, the step of providing a first planarized layer of insulating material comprises:

providing a conformal first layer of insulating material atop the first oxide layer; and chemical mechanical polishing the wafer to planarize the first insulating layer.

In accordance with yet another aspect of the invention, a semiconductor device comprises:

conductive runners formed on the semiconductor wafer, individual runners having a top and sides;

insulative spacers provided on the sides of the conductive runners, the spacers of adjacent runners being spaced a selected distance apart at selected locations on the wafer;

active areas positioned between the conductive runners at the selected locations;

an insulating layer with an upper surface formed over the runners, the insulating layer having first contact openings between adjacent runners above the selected locations, the first contact openings having an aperture width at the upper surface which is greater than the selected distance;

conductive plugs disposed in the first contact openings to electrically contact the active areas, individual conductive plugs having a substantially flat upper surface, the upper surfaces of the conductive plugs being approximately uniform in elevational height across the wafer;

an oxide layer provided above the insulating layer and having second contact openings formed therethrough which extend to the upper surfaces of the conductive plugs; and a conductive layer disposed above the oxide layer and in the second contact openings to electrically contact the conductive plugs.

A semiconductor processing method of making electrical contact with an active area on a semiconductor wafer is described with reference to FIGS. 1-9. The same numbers have been used throughout these figures to reference like parts.

In FIG. 1, a section of a semiconductor wafer 10 has bulk substrate 12, field oxide 14, and active areas 16 and 18. Conductive runners 20, 22, 24, and 26 are provided over wafer 10. Individual runners have a polysilicon layer 28, a silicide layer 30, and an oxide layer 32. Gate oxide layers are omitted for purposes of clarity. Individual runners 20, 22, 24, and 26 have respective tops 20a, 22a, 24a, and 26a and respective sides 20b/20c, 22b/22c, 24b/24c, and 26b/26c.

An insulative layer is provided over wafer 10, and then patterned and etched to define insulative spacers 34 on the sides of conductive runners 20, 22, 24, and 26. Insulative spacers 34 on the sides of adjacent conductive runners 20, 22 and 24, 26 are spaced a distance D apart at a selected location on wafer 10 in which a buried contact is eventually formed.

An impurity is implanted into substrate 12 to define source/drain regions 36, 38, 40, and 42. In subsequent steps discussed below, buried contact openings are formed to expose source/drain region 38 of active area 16 and source/drain region 40 of active area 18.

Figure 2:
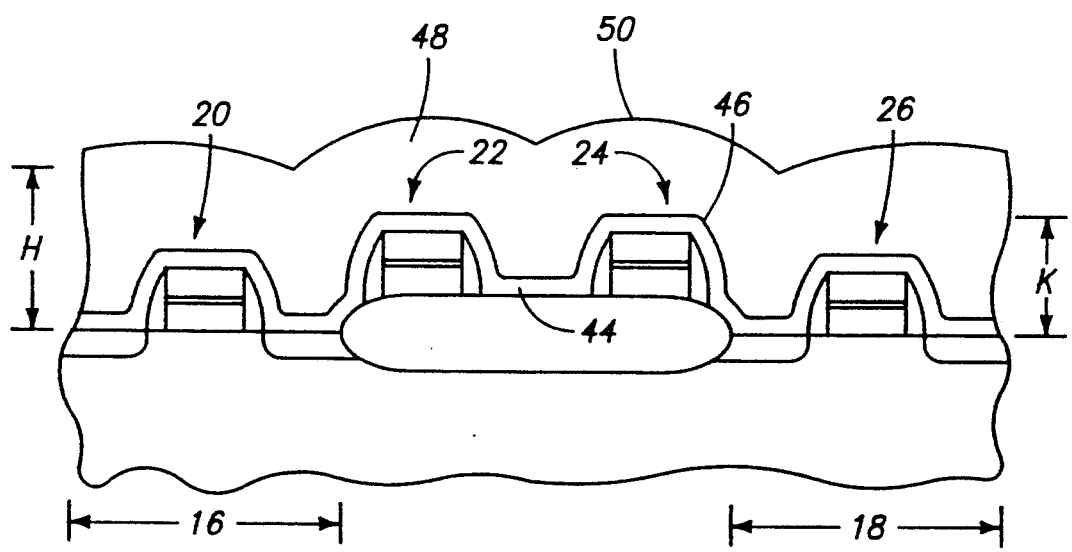
FIG. 2 is a diagrammatic section of the FIG. 1 wafer illustrated at a processing step subsequent to that shown in FIG. 1.

In FIG. 2, a first oxide layer 44 is provided over active areas 16 and 18 and conductive runners 20, 22, 24, and 26. First oxide layer 44 has a thickness less than one-half of distance D (FIG. 1) between insulative spacers 34 on the sides of adjacent conductive runners 20, 22 and 24, 26. First oxide layer 44 is preferably deposited to a thickness from about 100 to 1000 Angstroms, with a thickness from about 300 to 500 Angstroms being most preferred. First oxide layer 44 has an upper surface 46 with a contour conforming to the shape of the underlying semiconductor components. Upper surface 46 defines a highest elevational location K of first oxide layer 44 above active areas 16 and 18.

A thick conformal first layer of insulating material 48 is provided on top of first oxide layer 44. First insulating layer 48 is formed of a material which is selectively etchable relative to first oxide layer 44, and is preferably formed of a nitride. First insulating layer 48 has an upper surface 50 which generally follows the contour defined by the underlying topography of the runners and field oxide. Upper surface 50 defines a lowest elevational location H above active areas 16 and 18 which is elevationally higher than highest elevational location K of first oxide layer 44.

Figure 3:
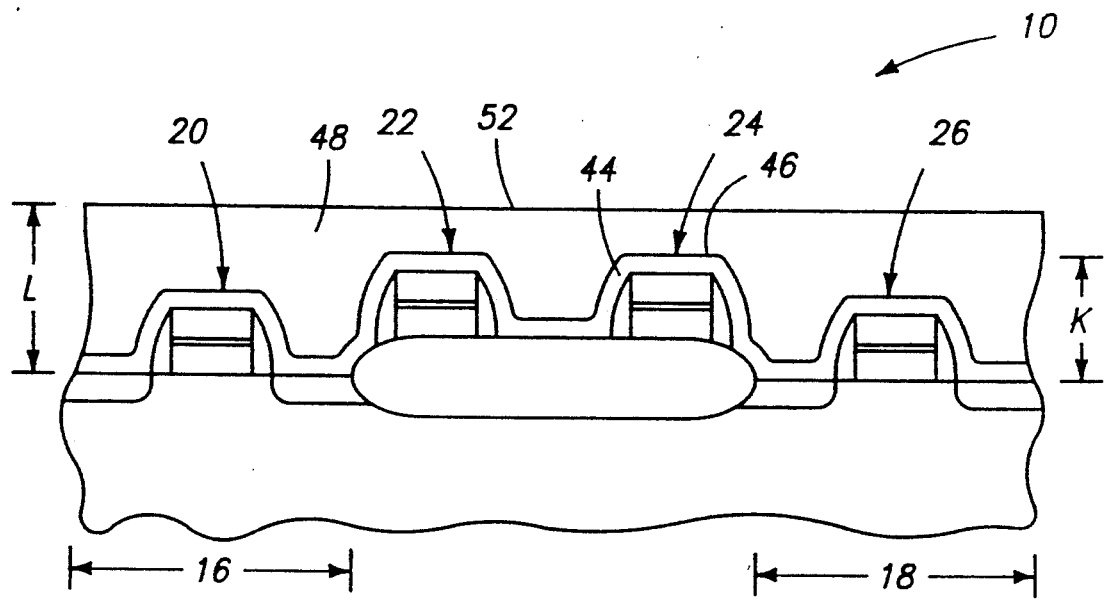
FIG. 3 is a diagrammatic section of the FIG. 1 wafer illustrated at a processing step subsequent to that shown in FIG. 2.

In FIG. 3, semiconductor wafer 10 undergoes chemical mechanical polishing (CMP) to planarize first insulating layer 48 and define a substantially flat upper surface 52. Planarized upper surface 52 is at an elevational location L above active areas 16 and 18 which is elevationally higher than highest elevational location K of first oxide layer 44. Although the preferred embodiment has been described as a two-step process involving depositing a conformal insulating layer followed by a CMP step to planarize the insulating layer, first insulating layer 48 may be deposited in a manner to provide a substantially planarized upper surface without the need for a subsequent CMP step.

Figure 4:
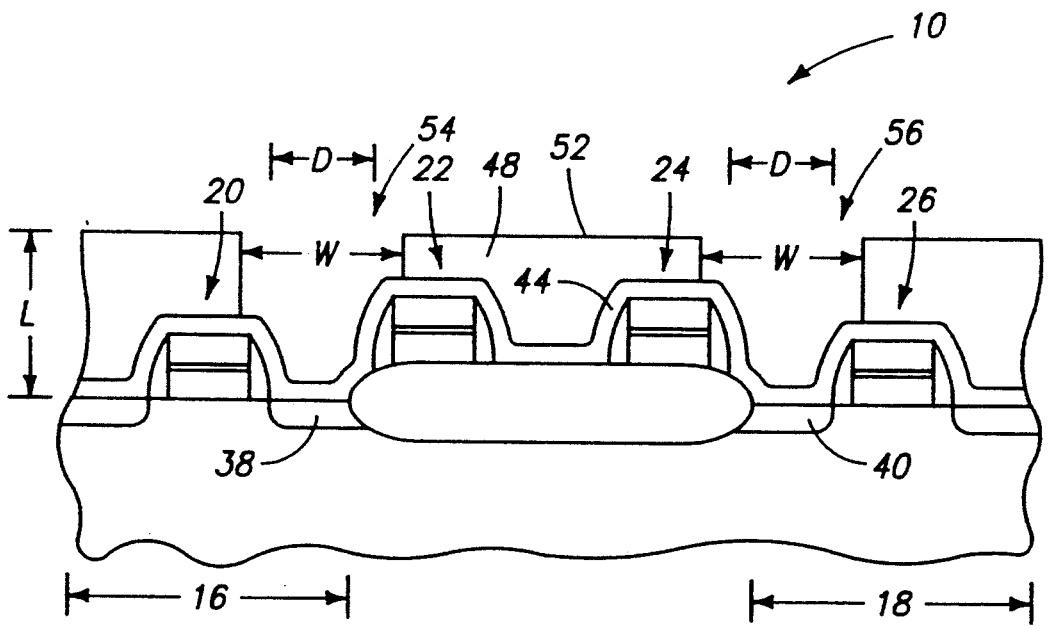
FIG. 4 is a diagrammatic section of the FIG. 1 wafer illustrated at a processing step subsequent to that shown in FIG. 3.

In FIG. 4, first insulating layer 48 is patterned by a mask (not shown) and etched selectively relative to first oxide layer 44 to define first contact openings 54 and 56 between adjacent conductive runners 20, 22 and 24, 26 above respective source/drain regions 38 and 40 of active areas 16 and 18. First contact openings 54 and 56 have an aperture width W at or near upper surface 52 which is greater than distance D between insulative spacers 34 on the sides of adjacent conductive runners 20, 22 and 24, 26.

In FIG. 5, first oxide layer 44 is etched within first contact openings 54 and 56 to expose respective active areas 16 and 18, or more specifically, respective source/drain regions 38 and 40 of active areas 16 and 18. This etching step is preferably a timed etch, selective to silicon, which removes the thin oxide layer 44 without detrimentally etching into insulative spacers 34 or oxide caps 32.

In FIG. 6, plugs 58 and 60 are provided within respective first contact openings 54 and 56 over the exposed active areas 16 and 18. Plugs 58 and 60 are formed of a conductive material and electrically contact source/drain regions 38 and 40. Preferably, plugs 58 and 60 are formed of polysilicon. Plugs 58 and 60 have respective substantially flat upper surfaces 62 and 64 which are at an elevational height M above active areas 16 and 18. Height M is preferably approximately equal to, or slightly lower than, elevational height L of the insulating layer upper surface 52. Plug surfaces 62 and 64 are approximately uniform in elevational height across the semiconductor wafer. The advantages of this globally uniform height are discussed below in more detail.

One of the advantages of this invention is that plugs 58 and 60 have relatively large upper surface areas. The distance across plugs 58 and 60 at upper surfaces 62 and 64 is equal to width W of contact openings 54 and 56

(FIG. 4). This distance is significantly greater than distance D (FIG. 1) of the buried contact region near source/drain regions 34 and 40 of substrate 12. Accordingly, the process of this invention effectively replaces a narrow contact area near the active area with a large contact area.

According to one aspect of the invention, conductive plugs 58 and 60 are formed by providing a layer of conductive material (preferably polysilicon) over first insulating layer 48 and within first contact openings 54 and 56. The semiconductor wafer is then subjected to chemical mechanical polishing to remove the conductive layer from upper surface 52 of first insulating layer 48. All the conductive material is removed from upper surface 52 to electrically isolate individual plugs 58 and 60 and to prevent formation of undesired stray conductive traces between conductive plugs 58 and 60. To help insure that all conductive material is removed from upper surface 52, plugs 58 and 60 are over polished such that plug surfaces 62 and 64 are slightly below first insulating layer upper surface 52. In this manner, individual plugs 58 and 60 are electrically isolated from one another.

An alternative technique to chemical mechanical polishing is to subject the layer of conductive material to a resist etch back process to define the slightly recessed plug surfaces 62 and 64 of respective plugs 58 and 60.

Figure 7:
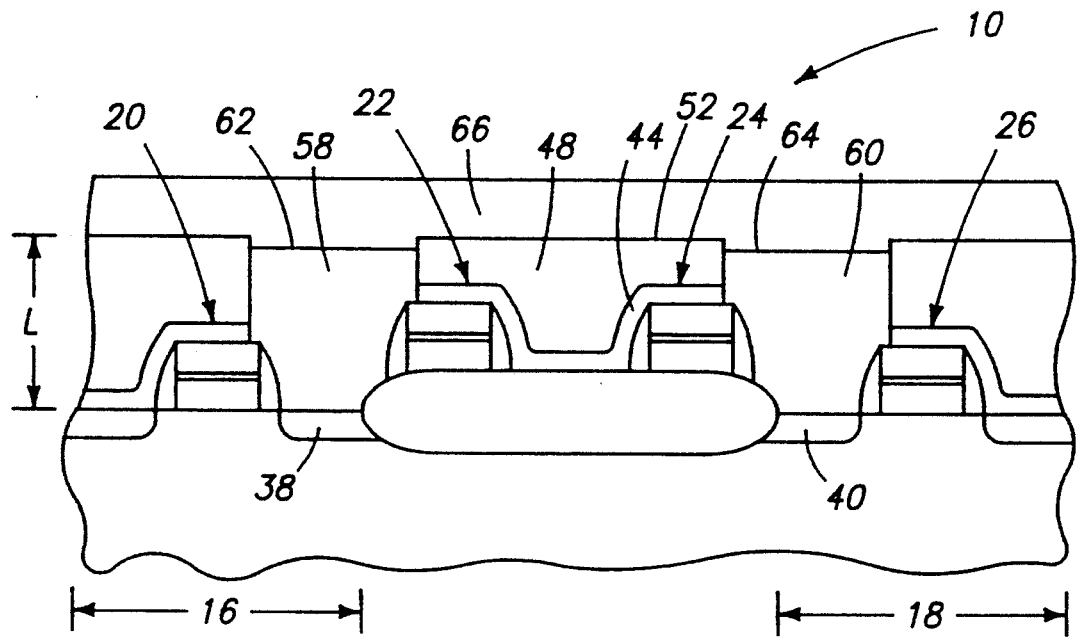
FIG. 7 is a diagrammatic section of the FIG. 1 wafer illustrated at a processing step subsequent to that shown in FIG. 6.

In FIG. 7, a second insulating layer 66 is provided over first insulating layer 48 and plugs 58 and 60. Second insulating layer 66 may be an oxide layer such as BPSG.

Figure 8:
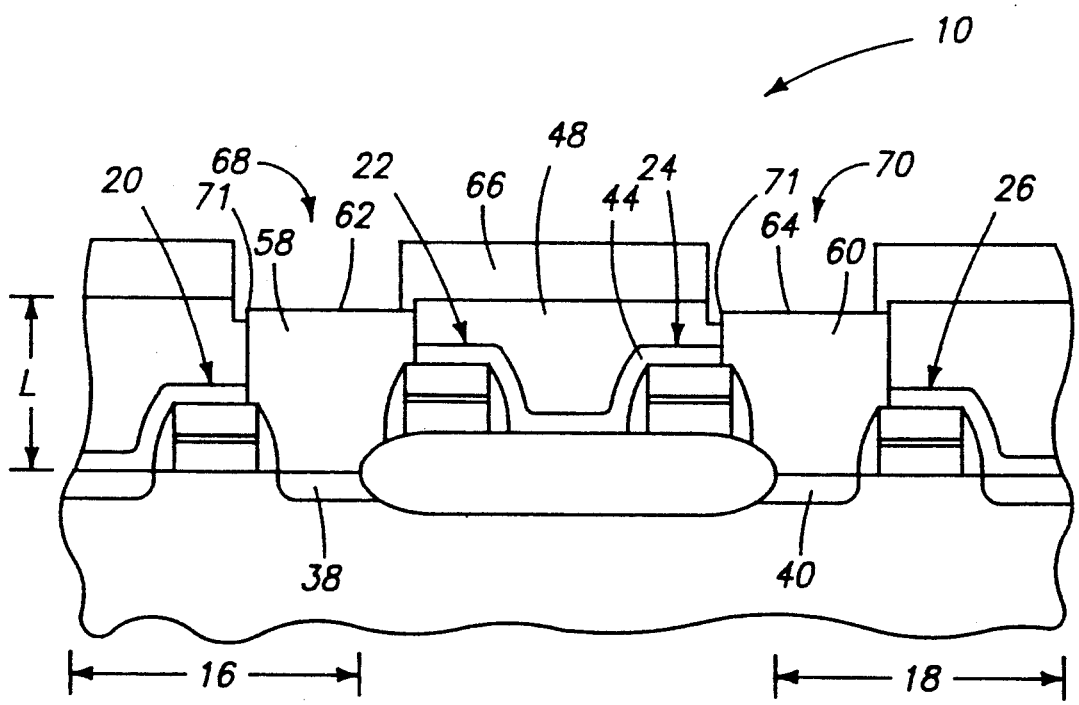
FIG. 8 is a diagrammatic section of the FIG. 1 wafer illustrated at a processing step subsequent to that shown in FIG. 7.

In FIG. 8, second insulating layer 66 is patterned beneath a mask (not shown) and etched to form second contact openings 68 and 70 which expose respective upper surfaces 62 and 64 of conductive plugs 58 and 60. Second insulating layer 66 is preferably dry etched with an etchant selective to both insulating layer 48 (which is preferably a nitride layer) and polysilicon plugs 58 and 60 (which are preferably polysilicon). Due to the relatively large surface areas of plugs 58 and 60 and the etch selectivity, conventional photolithographic techniques may be used to form second contact openings 68 and 70. First insulating layer 48 and oxide layer 44 assist in protecting conductive runners 20, 22, 24, and 26 during this etching step. The etchant may remove insulating layer 48 at a different rate than polysilicon plugs 58 and 60 as illustrated by surface level discontinuities 71 at the interface between insulating layer 48 and plugs 58 and 60.

Figure 9:
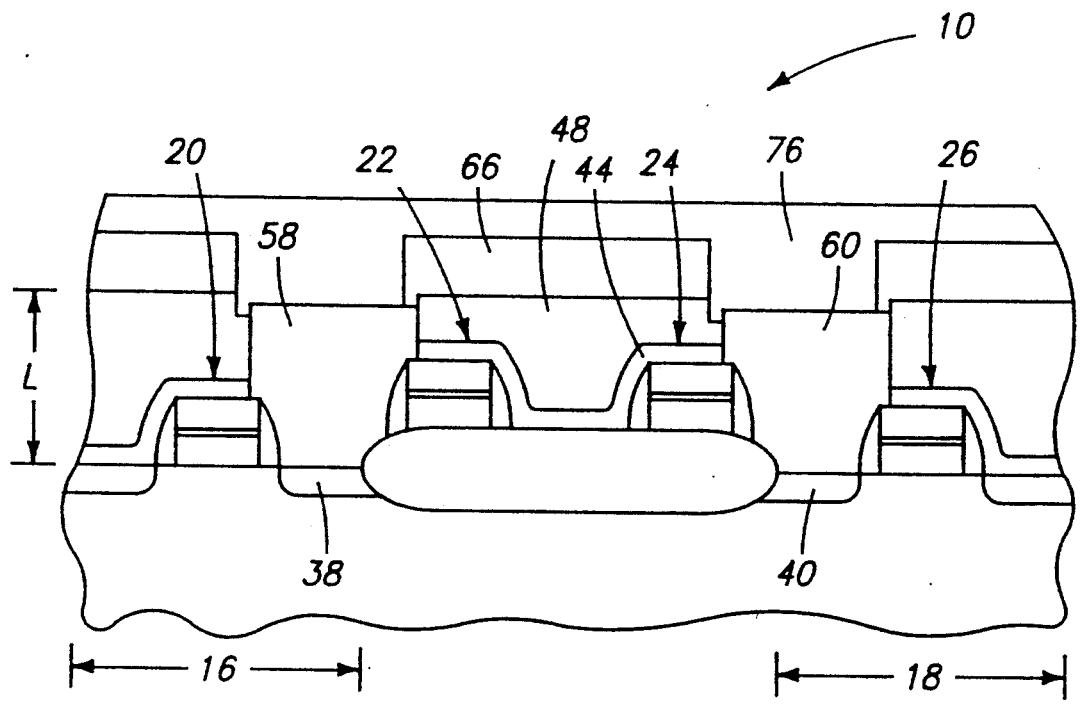
FIG. 9 is diagrammatic section of the FIG. 1 wafer illustrated at a processing step subsequent to that shown in FIG. 8.

In FIG. 9, a conductive layer 76 is provided over second insulating layer 66 and into second contact openings 68 and 70 to electrically contact plugs 58 and 60. Conductive layer 76 may be formed of polysilicon or metal.

Figure 10:
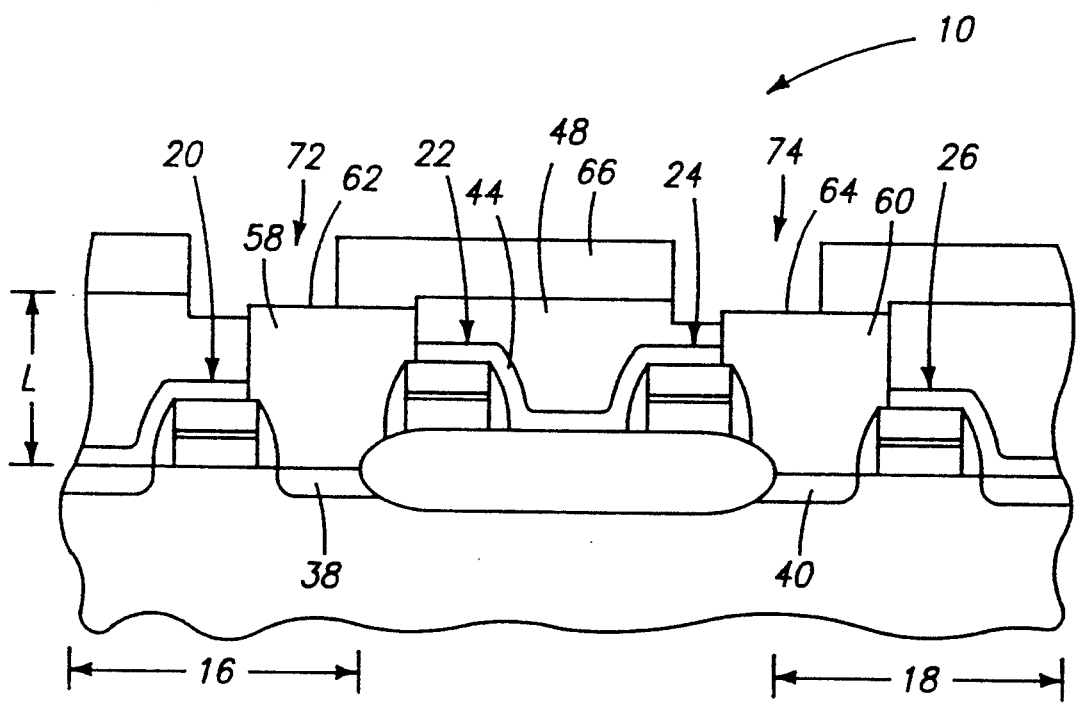
FIG. 10 is a diagrammatic section of the FIG. 1 wafer illustrated at a processing step subsequent to that shown in FIG. 7.

Another advantage provided by this invention relates to misalignment tolerance. In FIG. 10, second insulating layer 66 is undesirably patterned and etched to form misaligned contact openings 72 and 74. Despite this misalignment, however, electrical contact with active areas 16 and 18 is still achieved through respective plugs 58 and 60 due to the large surface area at upper plug surfaces 62 and 64 (in comparison to the narrow distance D of the buried contact opening between adjacent runners near active areas 16 and 18). Additionally, etching second contact layer 66 with an etchant selective to both first insulating layer 48 and conductive plugs 58 and 60 permits significant misalignment while still protecting the underlying structure. The present invention therefore provides desirable misalignment tolerance which results in higher yields of processed semiconductor devices.

This invention defines a processing method for sub-micron geometries, and is most useful at geometries of less than 0.4 micron. The combined thin oxide and thick nitride layers afford a structure suitable for highly selective etching to define contact openings on the scale of 0.3 to 0.4 micron. The uniformly elevated and significantly wide landing plugs provide an easy target for conventional photolithographic techniques when forming the second contact openings. Additionally, the wide landing plugs provide misalignment tolerance which helps increase production yield.

In compliance with the statute, the invention has been described in language more or less specific as to methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of making electrical contact with an active area on a semiconductor wafer, the method comprising the following steps:

providing a pair of conductive runners on a semiconductor wafer, individual conductive runners having sides;

providing an insulative layer on the sides of the conductive runners, the insulative sides of adjacent conductive runners being spaced a selected distance apart at a selected location on the wafer;

providing an active area between the conductive runners at the selected location;

providing a layer of first oxide to a selected thickness over the active area and conductive runners, the first oxide layer selected thickness being less than one-half the selected distance between the insulative sides of adjacent conductive runners;

providing a first planarized layer of insulating material atop the first oxide layer, the first layer of insulating material being selectively etchable relative to the first oxide, the first layer of insulating material having an upper surface;

patterning the planarized first insulating layer for definition of a first contact opening therethrough to the active area;

etching the patterned first insulating layer selectively relative to the first oxide layer to define the first contact opening therethrough, the first contact opening having an aperture width at the planarized first insulating layer upper surface, the aperture width being greater than the selected distance between the insulative sides of adjacent conductive runners;

etching the first oxide layer within the first contact opening to expose the active area;

providing a plug of conductive material within the first contact opening over the exposed active area;

providing a second insulating layer over the first insulating layer and the conductive plug;

patterning and etching the second insulating layer to form a second contact opening to and exposing the conductive plug; and providing a conductive layer over the second insulating layer and into the second contact opening, the conductive layer electrically contacting the conductive plug.

2. A semiconductor processing method according to claim 1 wherein the selected first oxide layer thickness is from about 100 to 1,000 Angstroms.

3. A semiconductor processing method according to claim 1 wherein the selected first oxide layer thickness is from about 300 to 500 Angstroms.

4. A semiconductor processing method according to claim 1 wherein the first insulating layer is formed of a nitride.

5. A semiconductor processing method according to claim 1 wherein the conductive plug is formed of polysilicon.

6. A semiconductor processing method according to claim 1 wherein the step of providing a first planarized layer of insulating material comprises:
providing a conformal first layer of insulating material atop the first oxide layer; and
chemical mechanical polishing the wafer to planarize the first insulating layer.

7. A semiconductor processing method according to claim 1 wherein the first insulating layer has an upper surface and wherein the step of providing a plug of conductive material comprises:
providing a layer of conductive material over the first insulating layer and within the first contact opening over the exposed active area;
chemical mechanical polishing the wafer to remove the conductive layer from the first insulating layer upper surface and to define a plug within the first contact opening, the plug having an upper surface slightly below the first insulating layer upper surface to ensure that the plug is electrically isolated.

8. A semiconductor processing method according to claim 1 wherein the second insulating layer is etched with an etchant selective to both the first insulating layer and the conductive plug.

9. A semiconductor processing method according to claim 1 wherein:
the first insulating layer is formed of a nitride;
the conductive plug is formed of polysilicon; and
the second insulating layer is etched with an etchant selective to both the nitride insulating layer and the polysilicon plug.

10. A semiconductor processing method for making electrical contact with an active area on a semiconductor wafer comprising the steps of:
providing a pair of conductive runners on a semiconductor wafer, individual conductive runners having a top and sides;
providing insulative spacers on the sides of the runners, the insulative spacers being spaced a selected distance apart at a selected location on the wafer;
providing an active area between the conductive runners at the selected location;
depositing a first oxide layer over the wafer to a thickness from about 100 to 1,000 Angstroms, the first oxide layer having an upper surface defining a highest elevational location above the active area;
providing a nitride layer having an upper surface over the first oxide layer to a selected thickness, the nitride layer upper surface defining a lowest elevational location above the active area which is elevationally higher than the highest elevational location of the first oxide layer, the nitride being selectively etchable relative to the first oxide;
planarizing the nitride layer to a first elevational height above the active area, the first elevational height being higher than the highest elevational location of the first oxide layer;
patterning the planarized nitride layer for definition of a first contact opening therethrough to the active area;
etching the patterned nitride layer selectively relative to the first oxide layer to define the first contact opening therethrough, the first contact opening having an aperture width at the nitride layer upper surface which is greater than the selected distance between the insulative sides of adjacent conductive runners;
etching the first oxide layer within the first contact opening to expose the active area;
providing a polysilicon plug within the first contact opening over the exposed active area to a second elevational height;
depositing a second oxide layer over the nitride layer and the polysilicon plug;
patterning and etching the second oxide layer to form a second contact opening to and exposing the polysilicon plug; and
providing a conductive layer over the second oxide layer and into the second contact opening, the conductive layer electrically contacting the conductive plug.

11. A semiconductor processing method according to claim 10 wherein the selected first oxide layer thickness is from about 300 to 500 Angstroms.

12. A semiconductor processing method according to claim 10 wherein the step of planarizing the nitride layer comprises chemical mechanical polishing the wafer to planarize the nitride layer.

13. A semiconductor processing method according to claim 10 wherein the step of providing a polysilicon plug comprises:
providing a layer of polysilicon over the nitride layer and within the first contact opening over the exposed active area;
chemical mechanical polishing the wafer to remove the polysilicon layer from the nitride layer upper surface and to define a polysilicon plug within the first contact opening.

14. A semiconductor processing method according to claim 10 wherein the second oxide layer is etched by an etchant selective to both the nitride layer and the polysilicon plug.

15. A semiconductor processing method according to claim 10 wherein the second elevational height is approximately equal to the first elevational height.

16. A semiconductor processing method according to claim 10 wherein the second elevational height is slightly lower than the first elevational height.

* * * * *